United States Patent
Kwon

(10) Patent No.: US 8,264,030 B2
(45) Date of Patent: *Sep. 11, 2012

(54) FLASH MEMORY DEVICE AND MANUFACTURING METHOD OF THE SAME

(75) Inventor: Young Jun Kwon, Chungbuk (KR)

(73) Assignee: Dongbu Hitek Co., Ltd., Seoul (KR)

( * ) Notice: Subject to any disclaimer, the term of this patent is extended or adjusted under 35 U.S.C. 154(b) by 300 days.

This patent is subject to a terminal disclaimer.

(21) Appl. No.: 12/643,473

(22) Filed: Dec. 21, 2009

(65) Prior Publication Data

US 2010/0165736 A1    Jul. 1, 2010

(30) Foreign Application Priority Data

Dec. 31, 2008 (KR) .................. 10-2008-0138836

(51) Int. Cl.
*G01L 21/336* (2006.01)

(52) U.S. Cl. ............. 257/324; 365/185.18; 365/185.26; 365/185.28; 257/E29.309

(58) Field of Classification Search ............. 365/185.18, 365/185.26, 185.28; 257/324, E29.309
See application file for complete search history.

(56) References Cited

U.S. PATENT DOCUMENTS

| 7,588,983 | B2* | 9/2009 | Park et al. | 438/257 |
| 7,718,488 | B2* | 5/2010 | Chen et al. | 438/257 |
| 2004/0256657 | A1* | 12/2004 | Hung et al. | 257/315 |
| 2008/0258205 | A1* | 10/2008 | Ishimaru et al. | 257/324 |
| 2010/0163966 | A1* | 7/2010 | Kwon | 257/324 |

* cited by examiner

*Primary Examiner* — Connie Yoha

(74) *Attorney, Agent, or Firm* — Saliwanchik, Lloyd & Eisenschenk

(57) ABSTRACT

A flash memory device and a method for manufacturing the same are provided. The flash memory device can include first and second memory gates on a substrate, an oxide layer on sides of and on the substrate outside of the first and second memory gates, a source poly contact between the first and second memory gates, first and second select gates outside the first and second memory gates, a drain region outside the first and second select gates, and a metal contact on the drain region and the source poly contact.

9 Claims, 8 Drawing Sheets

FLASH MEMORY DEVICE AND MANUFACTURING METHOD OF THE SAME

CROSS-REFERENCE TO RELATED APPLICATION

This application claims the benefit under 35 U.S.C. §119 of Korean Patent Application No. 10-2008-0138836, filed Dec. 31, 2008, which is hereby incorporated by reference in its entirety.

BACKGROUND

A flash memory device is a nonvolatile memory device that does not lose data stored therein even if power is turned off. In addition, the flash memory device can record, read, and delete data at a relatively high speed.

Flash memory devices are used as Bios of a personal computer (PC), a set-top box, a printer, and a network server in order to store data. Recently, flash memory devices have been used for digital cameras, portable phones, and other portable electronics.

In a flash memory device, a semiconductor device having a Silicon-Oxide-Nitride-Oxide-Silicon (SONOS) structure is typically used.

Unlike a flash memory device having a floating gate including polycrystalline silicon, a SONOS memory device is a charge-trap type device, in which gate voltage is applied to charges so that the charges pass through a thin oxide layer formed on silicon. The charges are injected into or released from a trap formed in a silicon nitride layer.

Electron injection schemes for a memory cell having a SONOS structure according to the related art can be classified into a Fowler-Nordheim (FN) tunneling scheme and a channel hot electron injection scheme. These two schemes each have advantages and disadvantages. The FN tunneling scheme has an advantage of low programming current, but a programming time on the order of a few milliseconds is required. In addition, a tunnel oxide layer must have a thickness of only 20 to 30 Å, so the FN tunneling scheme has a disadvantage in terms of retention. Further, a high gate bias is required, so a high voltage device, a driving circuit, and a pump circuit are necessary.

The channel hot electron injection scheme has an advantage of high speed programming on the order of a few microseconds, but high current of several hundreds of microamps is required for cell programming, so the channel hot electron injection scheme is not suitable for mobile products having high power consumption.

In addition, if a cell having a 1-Tr structure is used, over-erase may occur during the erase operation, so a recovery operation may be required. In order to avoid the over-erase, all cells must be controlled to have a uniform erase speed.

In a memory array according to the related art, high voltage is applied to a bit line, so an x-decoder used for selectively applying bias to a specific bit line must include a high voltage transistor that occupies a large area.

FIGS. 1A and 1B are cross-sectional views showing a procedure for manufacturing a flash memory device according to the related art.

Referring to FIG. 1A, when a split select gate is defined by a photo and etch process, select gate lengths of cells may be different from each other (L1≠L2) due to the overlay misalign in the photo process, so a left cell (A-Cell) may have different characteristics than a right cell (B-Cell).

Referring to FIG. 1B, when the split select gate is defined by the photo and etch process in a state in which a local nitride layer is used as a memory site, the cells may have various nitride lengths (L3≠L4) and select gate lengths (L1≠L2) due to the CD variation and overlay misalign in the photo process. Thus, characteristic variation of the left cell (A-Cell) and the right cell (B-Cell) can be increased.

BRIEF SUMMARY

Embodiments of the present invention provide a flash memory device and a manufacturing method thereof. The flash memory device can employ a channel hot electron scheme to achieve fast programming time, and can have a 2-Tr structure so that programming current can be reduced by using a select gate. Thus, the over-erase problem that may caused by a select gate can be inhibited. In addition, unnecessary circuits and unnecessary operations, such as a recovery operation or an iteration operation for inhibiting the over-erase, can be avoided.

In addition, the flash memory device can be capable of easily controlling programming current by adjusting a select gate and bias of a drain during the operation while realizing low power operation.

The present invention provides a flash memory device which can employs a channel hot electron injection scheme as the program scheme and a band to band tunneling (BTBT) hot hole scheme as the erase scheme. Thus, the program/erase operations can be performed under relatively low voltage, so that the number of high voltage devices, high voltage driving circuits, and high voltage pumping circuits can be reduced. Accordingly, the area of the peripheral region can be significantly reduced.

Also, embodiments provide a flash memory device having a self-align SONOS structure and a method for manufacturing the same, in which a self-align double spacer process can be used instead of a photo and etch process to form a cell. The present invention can solve the problems related to CD and overlay variation, thereby achieving cell uniformity while inhibiting degradation of characteristics.

Furthermore, embodiments provide a flash memory device and a method for manufacturing the same, in which a self-aligned source poly contact can be formed to reduce a source poly etch back process, thereby simplifying the manufacturing process.

In an embodiment of the present invention, a flash memory device can comprise: a first memory gate and a second memory gate on a substrate; an oxide layer along sides of the first memory gate, along sides of the second memory gate, on the substrate outside of the first memory gate, and on the substrate outside of the second memory gate; a source poly contact between the first memory gate and the second memory gate; a first select gate outside of the first memory gate; a second select gate outside of the second select gate; drain regions outside the first select gate and the second select gate; and metal contacts on the drain regions and on the source poly contact.

In another embodiment, a method for manufacturing a flash memory device can comprise: forming a first oxide layer on a substrate; forming a nitride layer on the first oxide layer; forming a second oxide layer on the nitride layer; forming a first polysilicon layer on the second oxide layer; forming a first memory gate and a second memory gate by patterning the nitride layer, the second oxide layer, and the first polysilicon layer; forming a third oxide layer on the substrate including on the first memory gate and the second memory gate; forming a source poly contact between the first memory gate and the second memory gate; forming a first select gate outside of the first memory gate and a second select gate outside of the second memory gate; forming drain regions outside of the first select gate and the second select gate through an ion implantation process; and forming metal contacts on the drain regions and on the source poly contact.

DETAILED DESCRIPTION

Hereinafter, a flash memory device and a method for manufacturing the same will be described with reference to accompanying drawings.

When the terms "on" or "over" are used herein, when referring to layers, regions, patterns, or structures, it is understood that the layer, region, pattern, or structure can be directly on another layer or structure, or intervening layers, regions, patterns, or structures may also be present. When the terms "under" or "below" are used herein, when referring to layers, regions, patterns, or structures, it is understood that the layer, region, pattern, or structure can be directly under the other layer or structure, or intervening layers, regions, patterns, or structures may also be present.

Figure 1A:
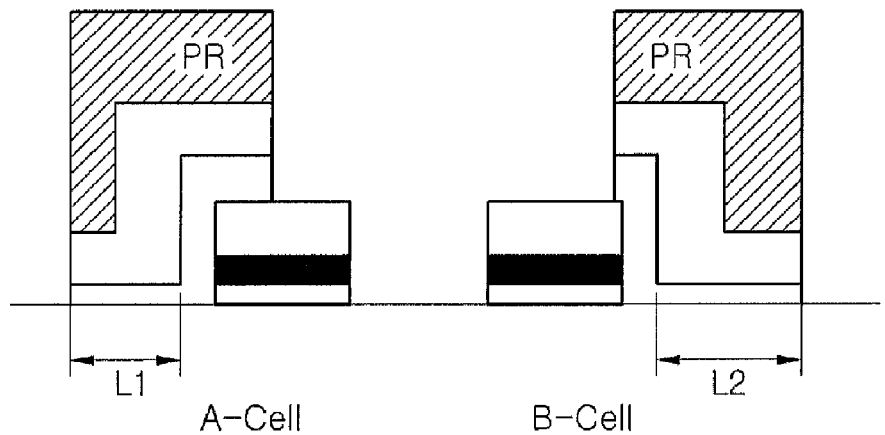
FIGS. 1A and 1B are cross-sectional views showing the method for manufacturing a flash memory device according to the related art.
Figure 1B:
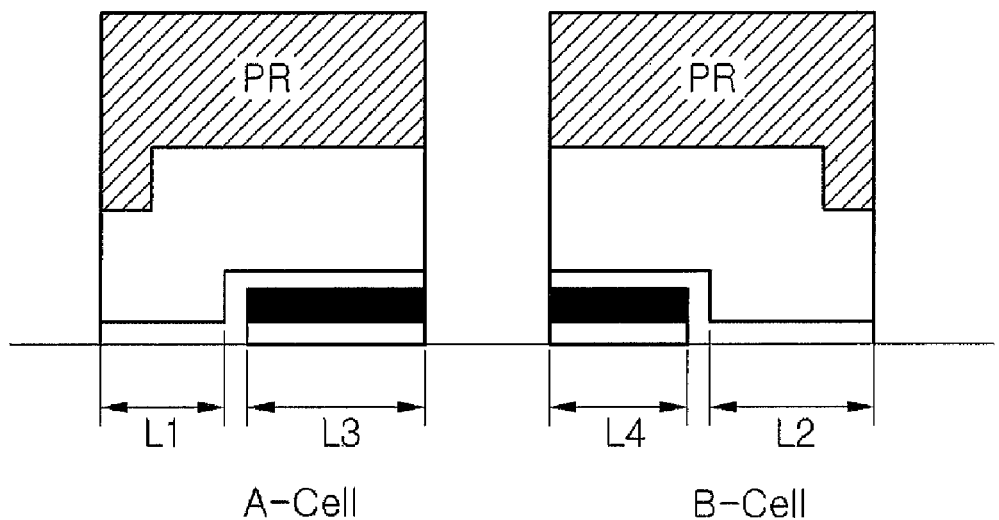
Figure 2A:
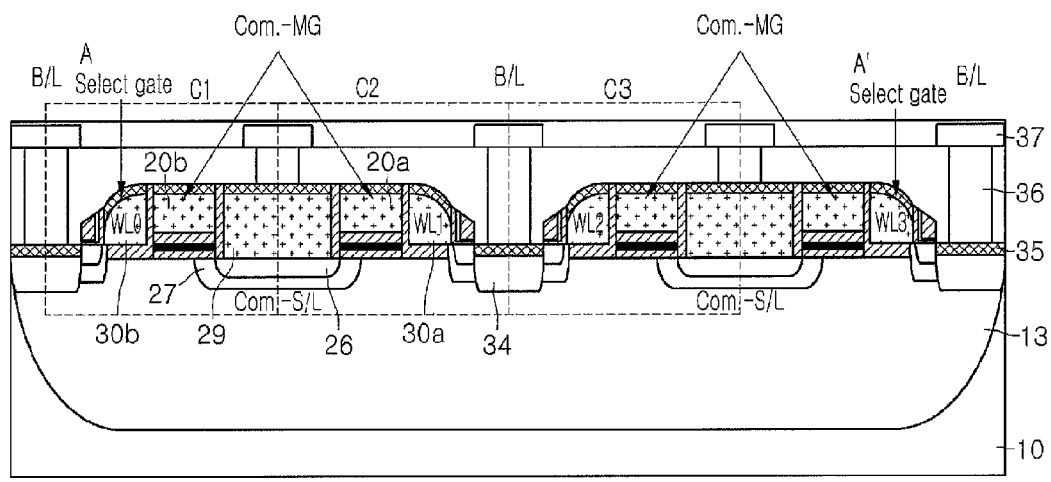
FIG. 2A is a cross-sectional view of a flash memory device according to an embodiment of the present invention.
Figure 2B:
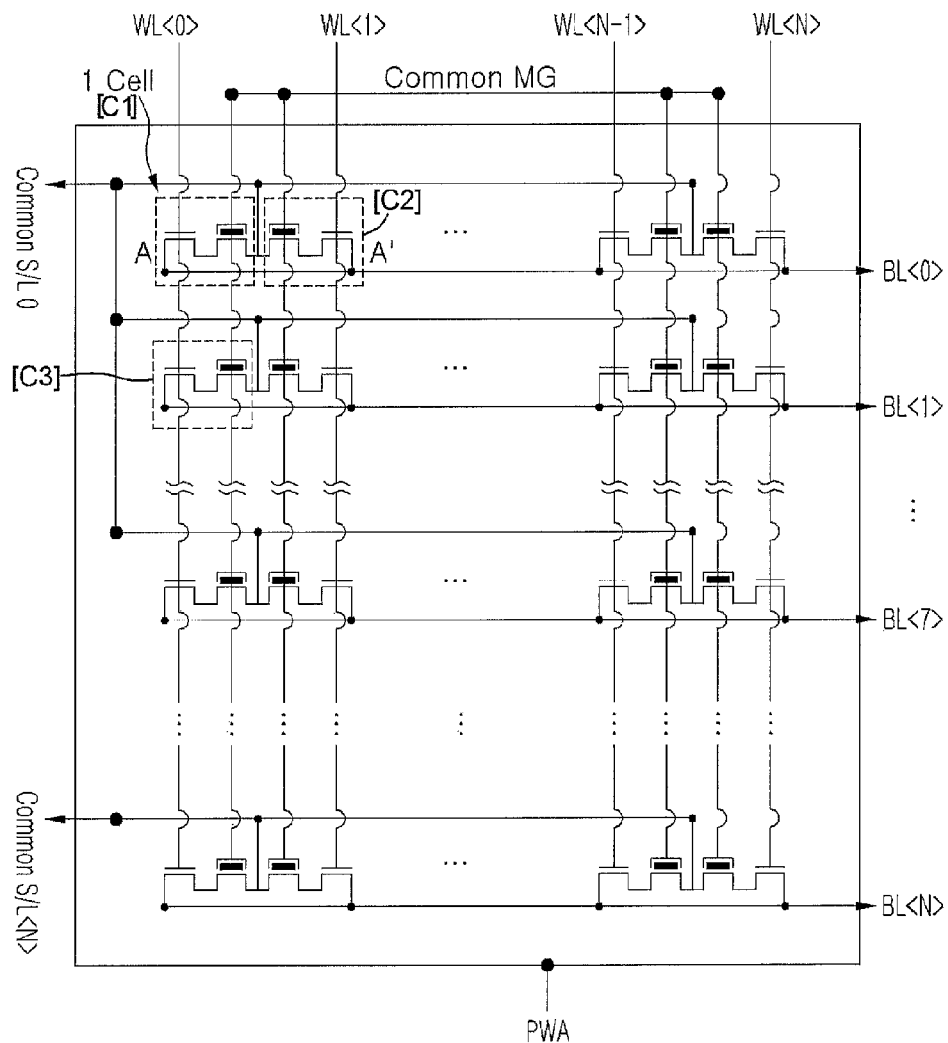
FIG. 2B is a schematic view of a cell array of a flash memory device according to an embodiment of the present invention.

FIG. 2A is a cross-sectional view of a flash memory device according to an embodiment of the present invention, taken along line A-A' of FIG. 2B. FIG. 2B is a schematic view of a cell array of a flash memory device according to an embodiment of the present invention.

Figure 14:
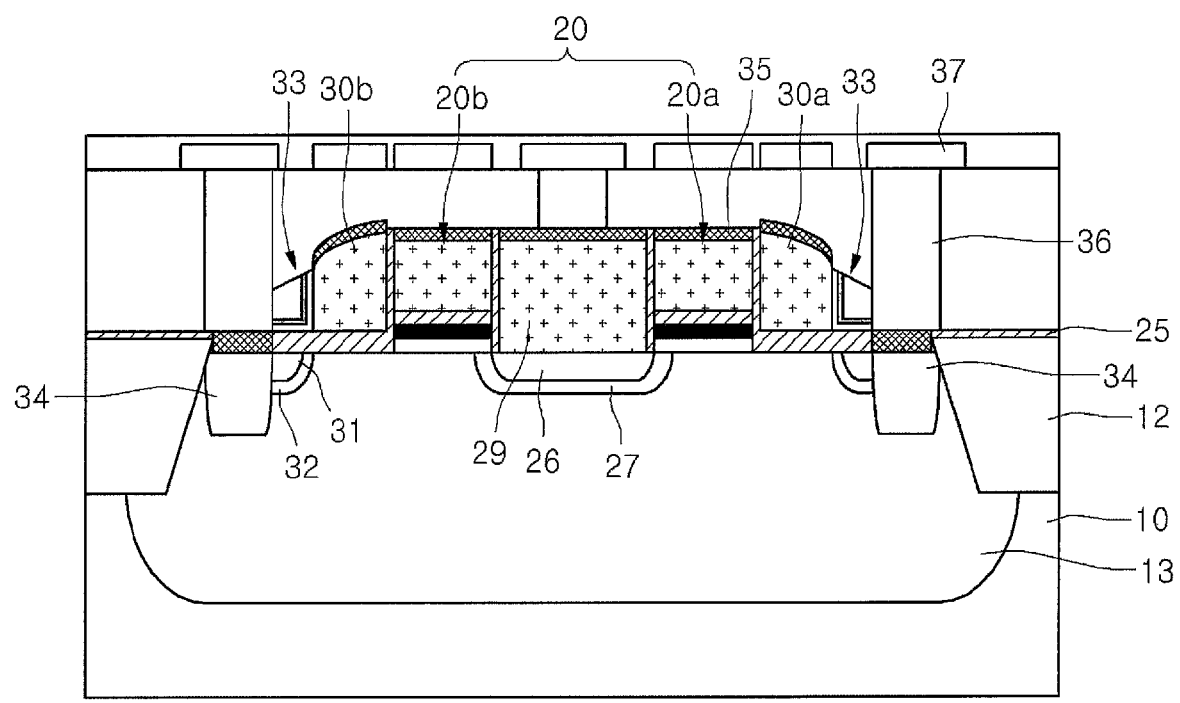

FIG. 14 is also a cross-sectional view of a flash memory device according to an embodiment of the present invention. Referring to FIG. 14, a flash memory device can include a first memory gate 20a and a second memory gate 20b on a substrate 10; a third oxide layer 25 inside and outside the first and second memory gates 20a and 20b; a source poly contact 29 between the first and second memory gates 20a and 20b; a first select gate 30a to the outside of the first memory gate 20a and a second select gate 30b to the outside of the second memory gate 20b; a drain region 34 outside the first and second select gates 30a and 30b; and a metal contact 36 on the drain region and the source poly contact 29.

Hereinafter, an operation of a flash memory device according to an embodiment will be described with reference to FIGS. 2A and 2B and Table 1. Table 1 shows the conditions for program, erase, and read operations in the flash memory device according to an embodiment.

TABLE 1

|  |  |  | PROGRAM | ERASE | READ |
|---|---|---|---|---|---|
|  | Method |  | Channel Hot Electron | BTBT Induced Hot Hole | Reverse |
|  | Minimum Oper. Unit |  | Bit | Sector | Bit |
| Selected | [C1] | W/L0 | Vt | 0 V | Vcc |
|  |  | Com. MG | VPP | −VPP | Vcc |
|  |  | Com. S/L0 | VPP | VPP | 0 V |

TABLE 1-continued

|  |  |  | PROGRAM | ERASE | READ |
|---|---|---|---|---|---|
|  |  | B/L0 | 0 V | 0 V or Floating | Vread |
|  |  | Com. Bulk | 0 V | 0 V | 0 V |
| Un-Selected | Same W/L [C4] | W/L0 | Vt | 0 V | Vcc |
|  |  | Com. MG | VPP | −VPP | Vcc |
|  |  | Com. S/L0 | VPP | VPP | 0 V |
|  |  | B/L1 | Floating or Back bias | 0 V | Floating or Back bias |
|  |  | Com. Bulk | 0 V | 0 V | 0 V |
|  | Same B/L [C2] | W/L1 | 0 V |  | 0 V |
|  |  | Com. MG | VPP |  | Vcc |
|  |  | Com. S/L0 | VPP |  | 0 V |
|  |  | B/L0 | 0 V |  | Vread |
|  |  | Com. Bulk | 0 V |  | 0 V |

The program operation of the flash memory device can be achieved by applying bias for generating hot carrier electrons.

The erase operation can be achieved by forming electron-hole pairs (EHP) while applying bias that enables formation of the BTBT.

Since the erase operation can be performed in a unit of W/L (word line), cells aligned in the same word line of a selected cell can be completely erased.

That is, the cells aligned in the same word line of the selected cell are erased even if the cells are unselected cells.

In the read operation, current can be applied according to bias applied to a drain region. Since the current applied during the program operation can be different from the current applied during the erase operation, it is possible to distinguish the program operation and the erase operation from each other based on the current.

1) Program Operation

Referring to FIGS. 2A and 2B and Table 1, the program operation can be achieved through a channel hot electron scheme. Regarding the bias condition, bias Vt sufficient for forming a channel below a select gate is applied the select gate through a W/L WL0, and bias is applied to a common source side Com-S/L and a common memory gate Com-MG, respectively, in such a manner that hot electrons can be injected into a trap nitride layer below a memory gate. In the case of unselected cells C2 and C4, as shown in Table 1, 0V can be applied to the W/L WL1 of C2 and floating or back bias can be applied to the B/L BL1 of C4 to inhibit the program operation. Thus, a minimum program unit can be 1 bit. In this case, the program operation can be achieved through the source side injection scheme by adjusting source bias and gate bias. The VPP refers to pumping bias.

2) Erase Operation

The erase operation can be achieved through a BTBT induced hot hole injection scheme. Regarding the bias condition, reverse bias can be applied to a source and a well to generate the EHP through BTBT. At this time, the holes can be accelerated by the lateral field, so that the holes are injected into the trap nitride layer by negative bias trapped in the memory gate.

3) Read Operation

The read operation can be achieved in the direction reverse to the program/erase direction.

Since the flash memory device according to an embodiment can have a cell having a 2-Tr structure, over-erase can be inhibited, so complicated circuits employed in a NOR flash memory device to solve the over-erase problem can be omitted.

In addition, the cell size can be very small relative to the cell having the 2-Tr EEPROM structure.

Further, since the embodiment can employ the hot carrier injection scheme during the program operation, a fast program speed can be realized and the problem of current consumption can be solved by using the select gate and back bias.

Also, since the embodiment can employ the BTBT hot hole injection scheme, the erase speed can be faster than that of the NOR flash according to the related art.

Since the program/erase operations can be performed under relatively low bias, the number of voltage pumping circuits, high voltage devices, and decoders can be reduced, thereby reducing the chip size.

Moreover, the embodiment can employ a self-aligned source poly contact, so time and labor force required for removing poly of the source region without damage can be saved. When the mask and photo step is performed in the ion implantation process for the source region, only the etching process for an oxide layer may be included, so that the process can be simplified and the process time can be shortened, thereby reducing the manufacturing cost.

According to the embodiment, the ion implantation process for the cell drain can be performed simultaneously with the LDD ion implantation process for the transistor provided in the peripheral region without patterning the drain of the cell using photoresist. This process can be applied to other non-volatile memory devices and can substitute for the recessed common source (RCS) process and the active common source (ACS) process.

In addition, an area of a source side can be significantly reduced, such that the embodiment is advantageous in terms of shrinkage of the cell.

The cell represents characteristics sensitive to lengths of the nitride layer and the select gate. According to the related art, the photo and etch process is performed to control the lengths of the nitride layer and the select gate. However, embodiments of the present invention can solve the problems related to the CD and overlay variation by employing the self-align scheme, so the present invention can obtain superior characteristics in terms of uniformity of cell characteristics.

Hereinafter, a method for manufacturing a flash memory device according to an embodiment of the present invention will be described with reference to FIGS. 3 to 14.

Figure 3:
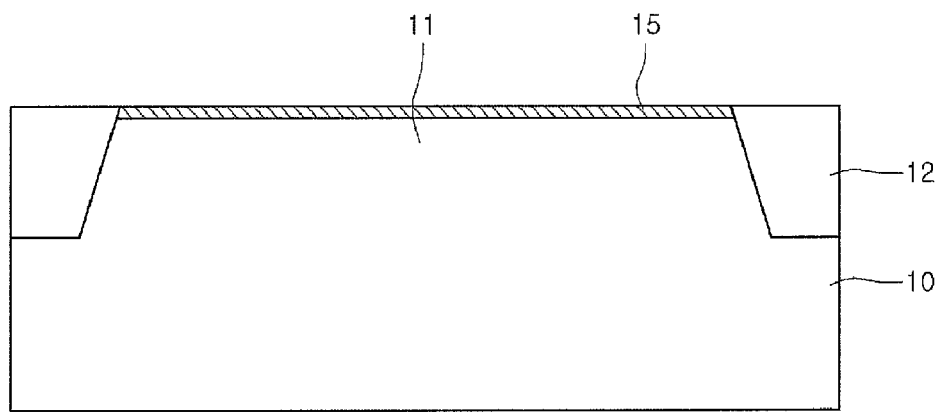
FIGS. 3 to 14 are cross-sectional views showing a method for manufacturing a flash memory device according to an embodiment of the present invention.

Referring to FIG. 3, an isolation layer 12 can be formed on a substrate 10 to define an active area 11. A pad oxide layer 15 can be formed on the active area.

Figure 4:
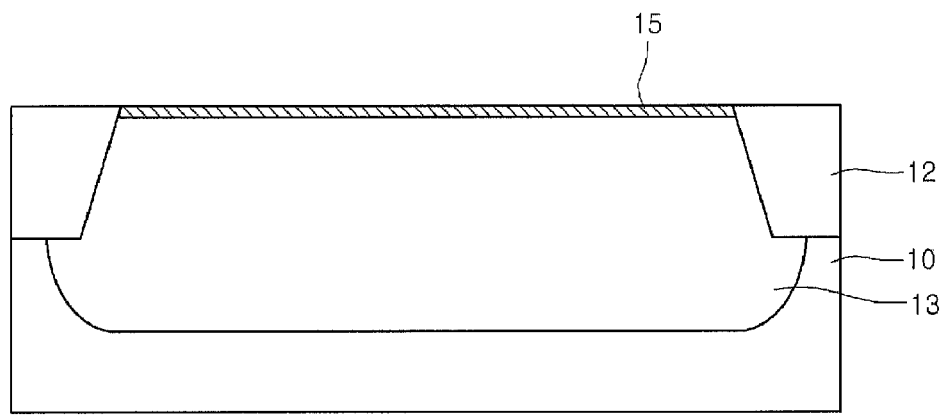

Referring to FIG. 4, a first ion implantation process can be performed on the substrate 10 to form a well area 13. For example, if the substrate 10 is a P type substrate, N type ions can be implanted to form an N type well. If the substrate is an N type substrate, P type ions can be implanted to form a P type well. In an embodiment, a second ion implantation process can be performed on the substrate 10 having the well area 13 to adjust threshold voltage.

Figure 5:
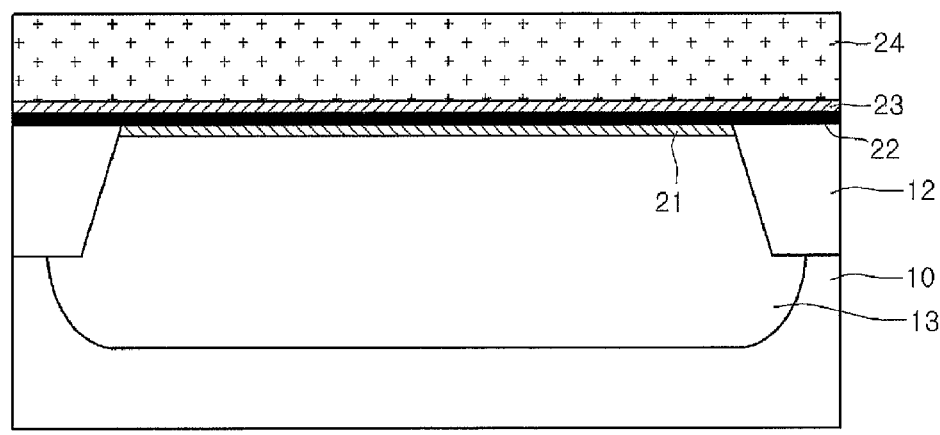

Referring to FIG. 5, the pad oxide layer 15 can be removed and a first oxide layer 21, a first nitride layer 22, a second oxide layer 23, and a first polysilicon layer 24 can be sequentially formed on the substrate 10.

For instance, the first oxide layer 21 can serve as a tunnel oxide layer. The first oxide layer 21 can be, for example, $SiO_2$, though embodiments are not limited thereto. In an embodiment, the first oxide layer can be formed on the substrate 10 to a thickness of from about 20 Å to about 80 Å by performing a heat treatment process with respect to the substrate 10. In another embodiment, the first oxide layer 21 can include a high-K material, such as $Al_2O_3$. The first oxide layer 21 can be deposited on the substrate 10 through, for example, a chemical vapor deposition (CVD) or atomic layer deposition (ALD) process.

The first nitride layer 22 can serve as, for example, a charge trap layer. The first nitride layer 22 can be, for example, a $Si_xN_y$ (where x and y are positive numbers) layer. In an embodiment, the first nitride layer 22 can be deposited on the first oxide layer 21 to a thickness of from about 70 Å to about 100 Å through a CVD process.

The second oxide layer 23 can serve as a top oxide layer. The second oxide layer 23 can be, for example, a $SiO_2$ deposited on the first nitride layer 22 through a CVD process, though embodiment are not limited thereto.

The first polysilicon layer 24 can be deposited on the second oxide layer 23.

Figure 6:
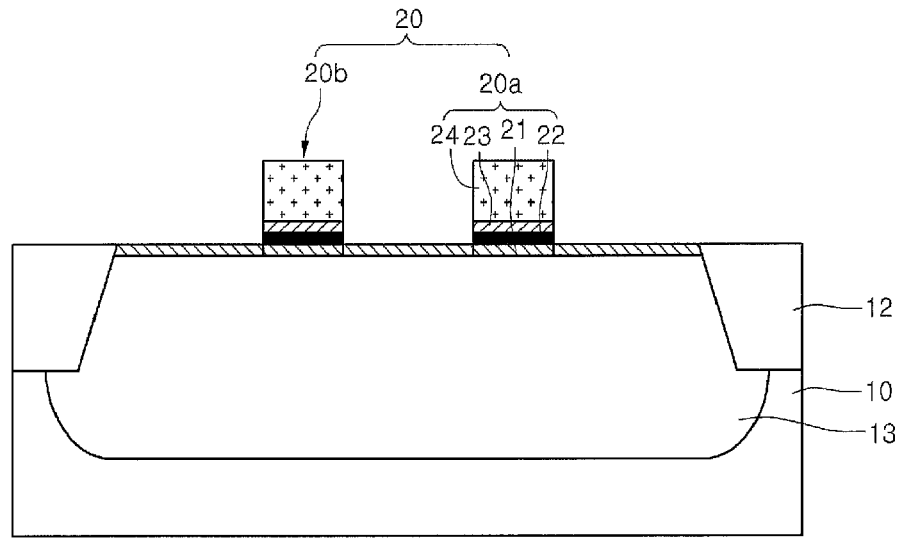

Referring to FIG. 6, the first nitride layer 22, the second oxide layer 23, and the first polysilicon layer 24 can be patterned to form a memory gate 20 including a first memory gate 20a and a second memory gate 20b. Thus, the memory gate 20 can have a SONGS structure.

In an embodiment, after forming a first photoresist pattern (not shown) on the first polysilicon layer 24 such that a portion of the first polysilicon layer 24 for the first memory gate 20a and the second memory gate 20b are exposed, the first polysilicon layer 24 can be etched to define the memory gate 20 (that is, the first memory gate 20a and the second memory gate 20b). The etching process can be performed on the first polysilicon layer 24, the second oxide layer 23, and the first nitride layer 22. Alternatively, the etching process can be performed in two steps, in which the first polysilicon layer 24 can be etched in the first step and the second oxide layer 23 and the nitride layer 22 can be etched in the second step. In the case of the two-step etching process, the second oxide layer 23 can serve as an etch stop layer in the first step, and the second oxide layer 23 and the first nitride layer 22 can be etched in the second step. The second step can be performed through, for example, a dry etching or wet etching process.

Figure 7:
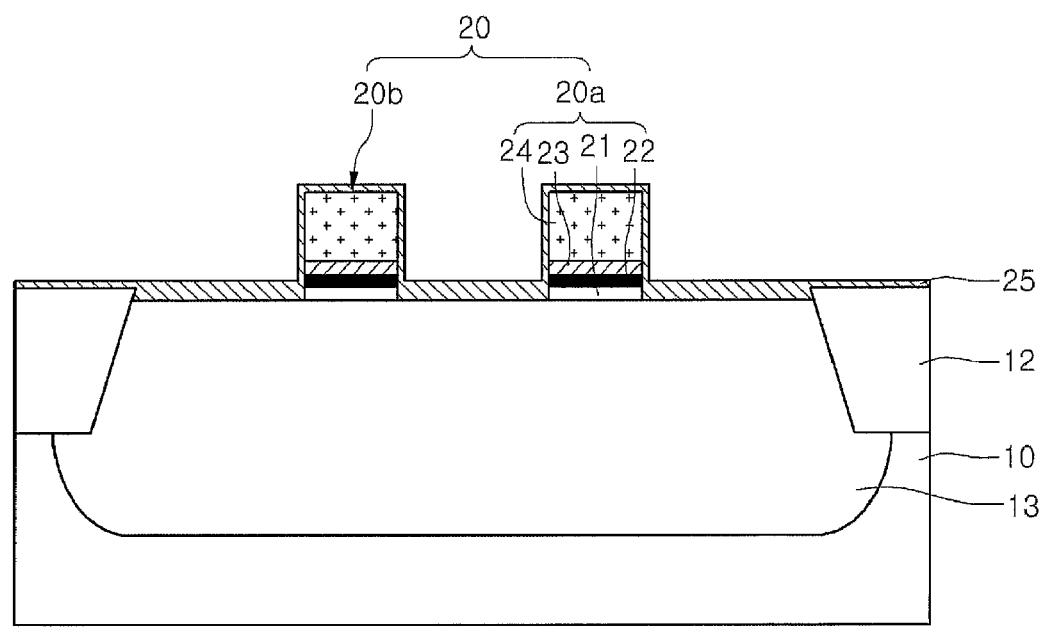

Then, referring to FIG. 7, a third oxide layer 25 can be formed over the entire surface of the substrate 10 including on the first and second memory gates 20a and 20b.

In an embodiment, a portion of the first oxide layer 21 on the substrate 10 and not corresponding to the memory gate 20 can be removed. That is, the first oxide layer 21 that is not under the remaining first nitride layer 22 within the first and second memory gates 20a and 20b can be removed, such that only the portions of the first oxide layer 21 that are under the remaining first nitride layer 22 within the first and second memory gates 20a and 20b remain. Next, a thermal oxidation process, for example a dual gate oxidation process, can be performed to form the third oxide layer 25. The third oxide layer 25 can be an oxide layer including a thick gate oxide layer and a thin gate oxide layer, or can be a thin gate oxide layer itself.

Select gates 30a and 30b, which will be formed later, can share the third oxide layer 25 as a select gate oxide.

Figure 8:
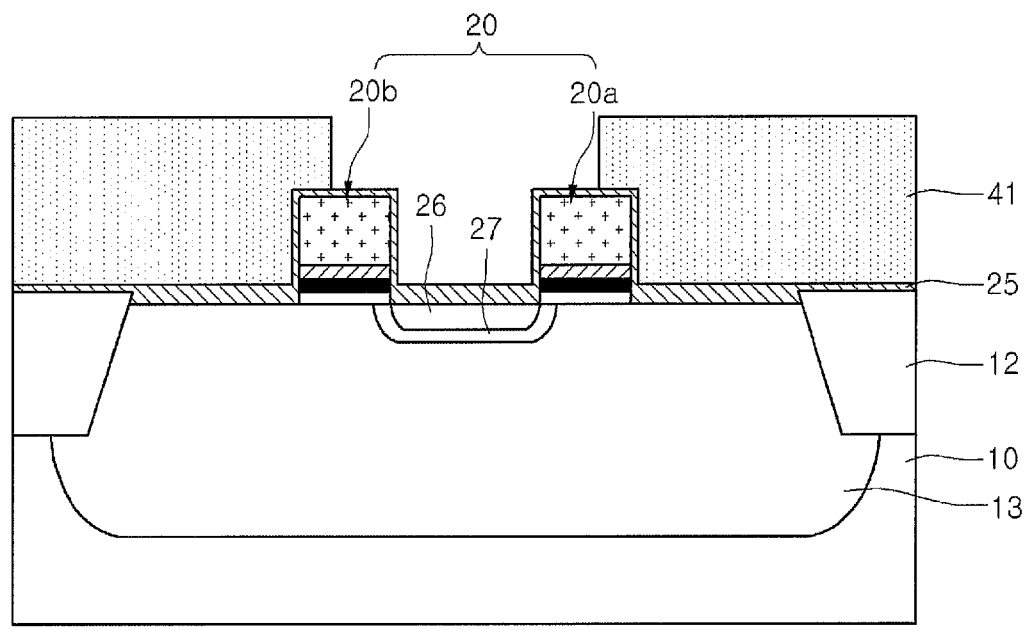

Referring to FIG. 8, a first halo ion implantation region 27 and a first lightly doped drain (LDD) ion implantation region 26 can be formed in the substrate 10 between the first and second memory gates 20a and 20b. The first halo ion implantation region 27 and the first LDD ion implantation region 26 can improve hot carrier injection (HCI) efficiency.

In an embodiment, after forming a source region (not shown) in the substrate 10 between the first and second memory gates 20a, the portion of the third oxide layer 25 that is over the source region can be removed (this portion of the third oxide layer 25 that can be removed can correspond to a portion of the third oxide layer 25 that is over the first LDD ion implantation region 26).

For example, a second photoresist pattern 41 can be formed that exposes only a source side of the cell, the ion implantation process can be performed to form the source region and then the oxide layer 25 over the source region can be completely etched.

Figure 9:
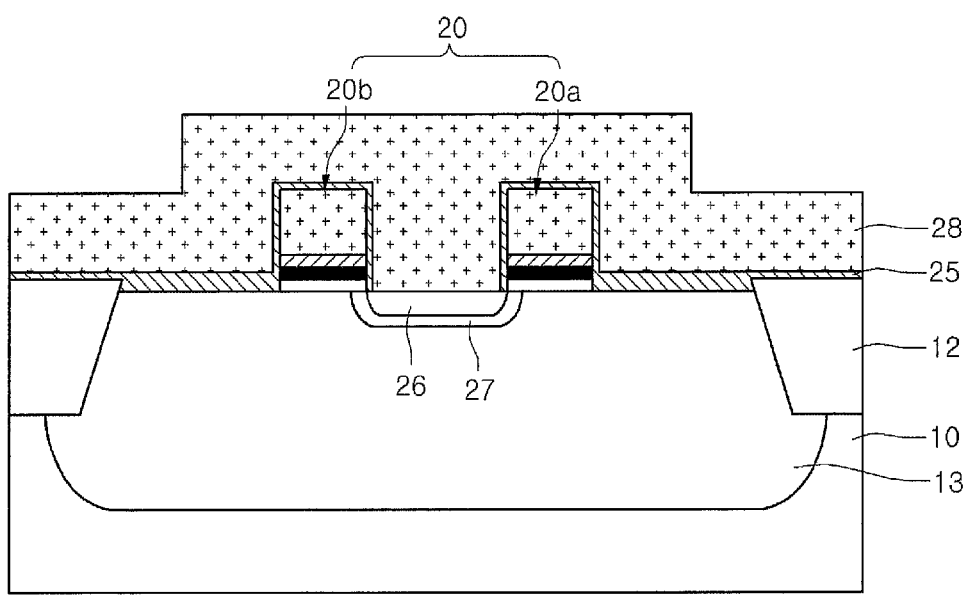

Referring to FIG. 9, a second polysilicon layer 28 can be formed on the entire surface of the substrate 10 having the source region, including on the first and second memory gates 20a and 20b.

In an embodiment, after removing the third oxide layer 25 between the first and second memory gates 20a and 20b, the second photoresist pattern 41 can be removed and then the second polysilicon layer 28 can be deposited. At this time, junctions of the source region and the second polysilicon layer 28 can be in contact with each other.

Figure 10:
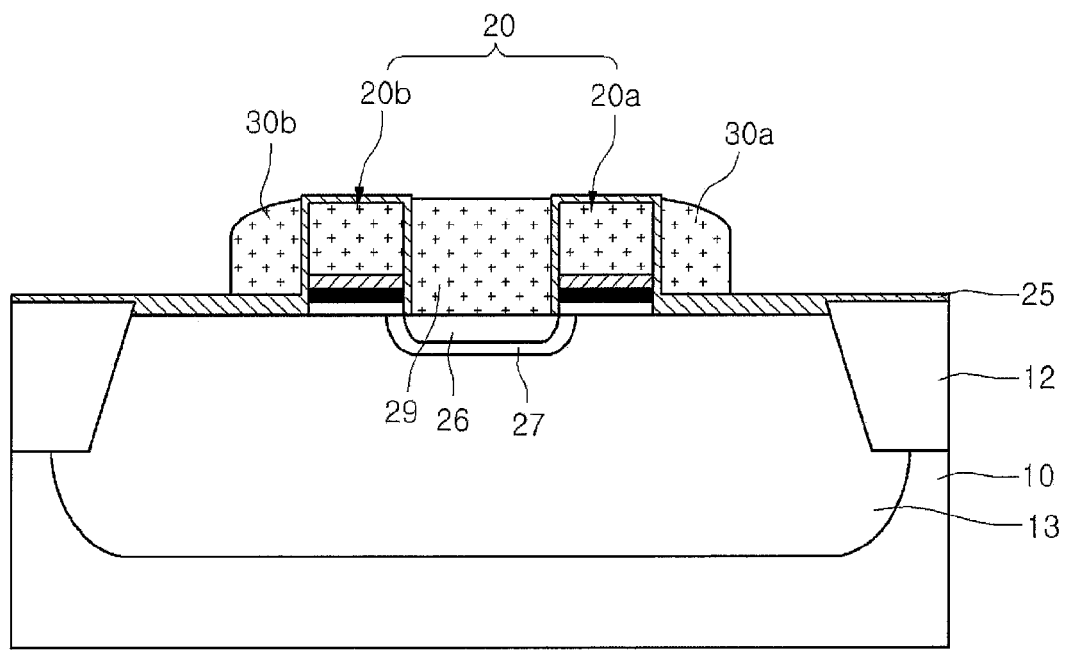

Referring to FIG. 10, the second polysilicon layer 28 can be etched to form a source poly contact 29 between the first and second memory gates 20a and 20b, and to form a first select gate 30a and a second select gate 30b outside the first and second memory gates 20a and 20b. That is, the first select gate 30a can be formed to the outside of the first memory gate 20a (to a side of the first memory gate 20a opposite the source poly contact 29), and the second select gate 30b can be formed to the outside of the second memory gate 20b (to a side of the second memory gate 20b opposite the source poly contact 29).

For example, the entire surface of the cell area can be etched through an etching process used for the second polysilicon layer 28. In an embodiment, the length of the select gates 30a and 30b can be determined according to a thickness of the second polysilicon layer 28.

The subject invention can solve the misalign problem of the cell by forming the select gates through the self-align scheme.

In addition, embodiments can employ the self-aligned source poly contact in the source region, so time and labor force required for removing poly of the source region without damage can be saved. Furthermore, embodiments can utilize the mask and photo step employed in the ion implantation process for the source region.

According to embodiments of the present invention, when the select gate poly is defined, patterning and etching processes can be performed by using a photoresist (not shown), thereby defining the peripheral gate poly. In addition, if the active area is damaged during the etching process, the photo and etching process to define the select gate poly of the cell can be performed separately from the photo and etching process to define the peripheral gate poly.

Figure 11:
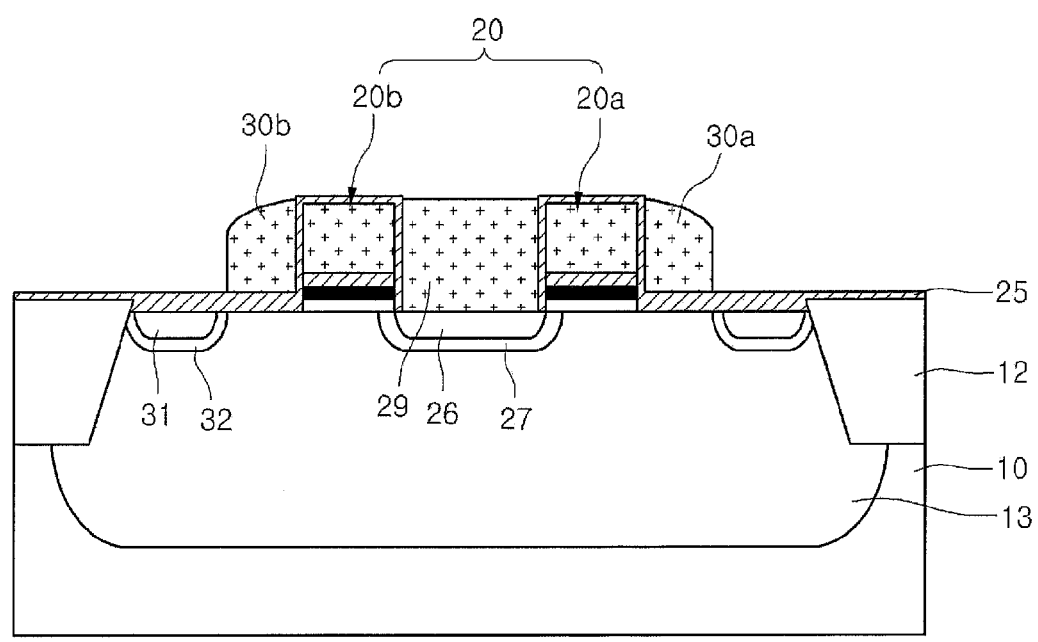

Then, referring to FIG. 11, a second halo ion implantation region 32 and a second LDD ion implantation region 31 can be formed outside the first and second select gates 30a and 30b. That is, a second halo ion implantation region 32 and a second LDD ion implantation region 31 can be formed to a side of the first select gate 30a opposite the first memory gate 20a. Also, a second halo ion implantation region 32 and a second LDD ion implantation region 31 can be formed to a side of the second select gate 30b opposite the second memory gate 20b.

In an embodiment, the second LDD ion implantation region 31 can be formed when the LDD ion implantation process is performed for a transistor provided in the peripheral region.

In a further embodiment, the source region can be filled with the poly, so that the additional patterning process to block the source region of the cell may not be required.

Figure 12:
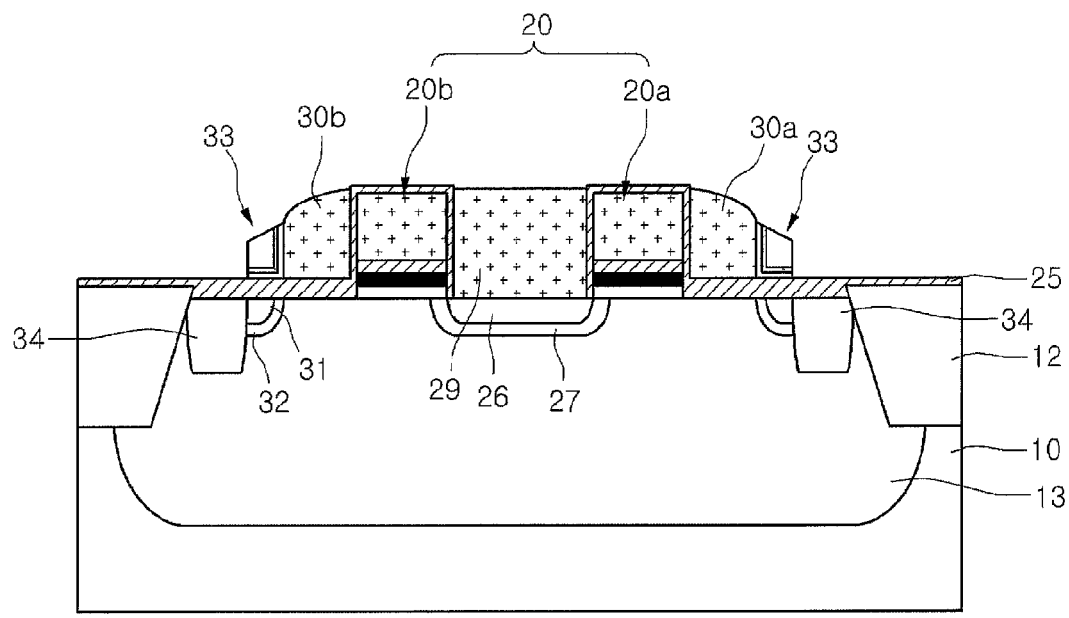

Next, referring to FIG. 12, a drain region 34 can be formed outside the first and second select gates 30a and 30b through an ion implantation process. That is, a drain region 34 can be formed in the substrate 10 to a side of the first select gate 30a opposite the first memory gate 20a. Also, a drain region 34 can be formed in the substrate 10 to a side of the second select gate 30b opposite the second memory gate 20b.

A spacer 33 can be formed outside the first and/or second select gates 30a and 30b. That is, a spacer 33 can be formed to a side of the first select gate 30a opposite the first memory gate 20a. Also, a spacer 33 can be formed to a side of the second select gate 30b opposite the second memory gate 20b.

The ion implantation process can be performed for the drain of the cell, thereby forming the drain region 34. In an embodiment, the ion implantation process for the drain of the cell can be performed simultaneously with the ion implantation process for the source and the drain of a transistor provided in the peripheral region.

The spacer 33 can have, for example, an oxide-nitride-oxide (ONO) structure or an oxide-nitride (ON) structure, though embodiments are not limited thereto.

Figure 13:
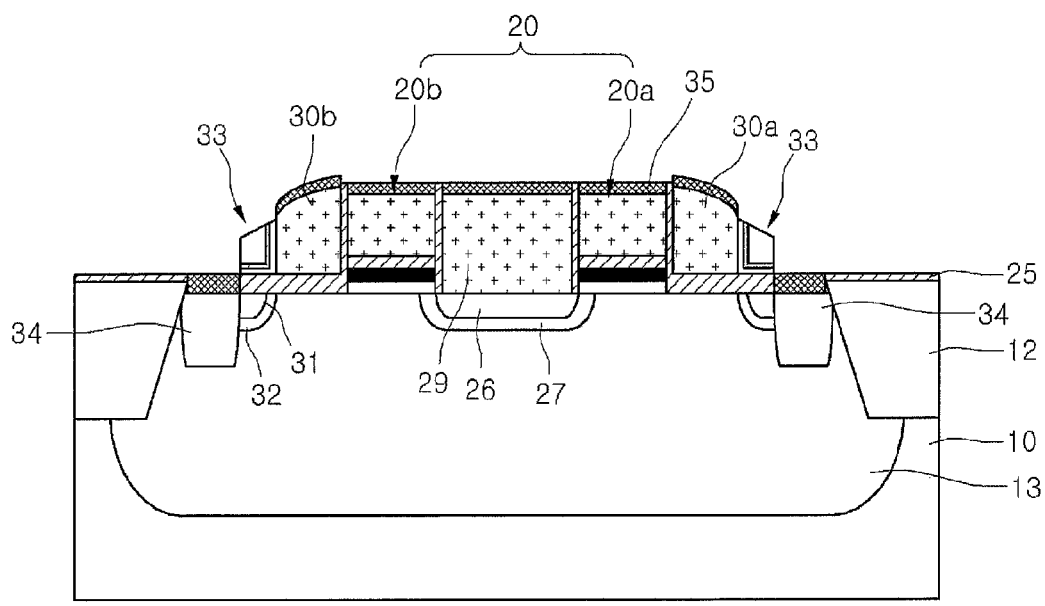

Referring to FIG. 13, the third oxide layer 25 can be removed from the drain region 34 and the memory gate 20. That is, the portions of the third oxide layer 25 on the drain region 34 and on the first and second memory gates 20a and 20b can be removed.

A metal layer can be formed on the substrate 10. The metal layer can be formed on the entire surface of the substrate 10, including on the source poly contact 29, the first and second memory gates 20a and 20b, and the first and second select gates 30a and 30b. The metal layer can be, for example, a cobalt (Co) layer, though embodiments are not limited thereto.

A salicide process can be performed to form salicide layers 35 on the drain region 34, the select gates 30a and 30b, and the first and second memory gates 20a and 20b. The salicide process can be, for example, a heat treatment process.

Referring to FIG. 14, a back end process can be performed to form a metal contact 36 on the drain region(s) 34 and on the source poly contact 29 and to form a metal line (or metal lines) 37 on the metal contact(s) 36 over the drain region 34 and over the source poly contact 29.

According to embodiments of the present invention, a source contact can include a self-aligned poly contact, and bias can be applied to the self-aligned poly contact, thereby transferring the bias to the source region through the source poly contact.

According to the flash memory device and the method for manufacturing the same of the present invention, a self-aligned source poly contact can be employed, so time and labor force required for removing poly of the source region without damage can be saved. Furthermore, when the mask and photo step is performed in the ion implantation process for the source region, only the etching process for an oxide layer can be included, so that the process can be simplified and the process time can be shortened, thereby reducing the manufacturing cost.

Also, an ion implantation process for the cell drain can be performed simultaneously with the LDD ion implantation process for a transistor provided in the peripheral region without patterning the drain of the cell using photoresist. This process can be applied to other non-volatile memory devices and can substitute for an RCS process and an ACS process.

In addition, an area of a source side can be significantly reduced, so that the present invention is advantageous in terms of shrinkage of the cell.

Moreover, the cell represents characteristics sensitive to lengths of the nitride layer and the select gate. According to the related art, the photo and etch process is performed to control the lengths of the nitride layer and the select gate. However, embodiments of the present invention can solve the problems related to CD and overlay variation by employing a self-align scheme, so superior characteristics can be obtained in terms of uniformity of cell characteristics.

The program operation of the flash memory device according to embodiments can be achieved by applying bias for generating hot carrier electrons, though embodiments are not limited thereto.

In addition, the erase operation can be achieved by forming EHP while applying bias that enables formation of the BTBT.

Since the erase operation can be performed in a unit of W/L (word line), cells aligned in the same word line of a selected cell can be completely erased.

That is, the cells aligned in the same word line of the selected cell are erased even if the cells are unselected cells.

In the read operation, current can be applied according to bias applied to a drain region. Since the current applied during the program operation can be different from the current applied during the erase operation, the program operation can be distinguished from the erase operation based on the current.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A flash memory device comprising:
   a first memory gate and a second memory gate on a substrate;
   an oxide layer along sides of the first memory gate, along sides of the second memory gate, on the substrate outside of the first memory gate, and on the substrate outside of the second memory gate;
   a source region filled a with poly on the substrate between the first memory gate and the second memory gate;
   a self-aligned source poly contact between the first memory gate and the second memory gate;
   a first select gate outside of the first memory gate;
   a second select gate outside of the second select gate;
   drain regions outside the first select gate and the second select gate; and
   metal contacts on the drain regions and on the source poly contact.

2. The flash memory device according to claim 1, further comprising a source region under and in contact with the source poly contact; wherein the source poly contact serves as a source contact; and wherein, during operation of the flash memory device, bias is applied to the source poly contact so that the bias is transferred to the source region through the source poly contact.

3. The flash memory device according to claim 1, further comprising a halo ion implantation region and an LDD ion implantation region on the substrate between the first memory gate and the second memory gate.

4. The flash memory device according to claim 1, further comprising the oxide layer on the substrate under the first select gate and on the substrate under the second select gate.

5. The flash memory device according to claim 4, wherein the oxide layer serves as a gate oxide layer for the first select gate and the second select gate.

6. The flash memory device according to claim 1, further comprising a source region in the substrate between the first memory gate and the second memory gate.

7. The flash memory device according to claim 1, wherein, during operation, the flash memory device performs a read operation in a direction reverse to a program direction.

8. The flash memory device according to claim 1, wherein, during operation, the flash memory device controls programming current by using bias applied to the first select gate and the second select gate.

9. The flash memory device according to claim 1, wherein, during operation, the flash memory device applies back bias to a source to control programming current.

* * * * *